US006229525B1

(12) United States Patent
Alexander (10) Patent No.: US 6,229,525 B1
(45) Date of Patent: *May 8, 2001

(54) SYSTEM AND METHOD FOR EFFICIENT HIT-TESTING IN A COMPUTER-BASED SYSTEM

(75) Inventor: Jay A Alexander, Monument, CO (US)

(73) Assignee: Agilent Technologies, Palo Alto, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/413,291

(22) Filed: Oct. 6, 1999

Related U.S. Application Data (63) Continuation of application No. 08/863,461, filed on May 27, 1997.

(51) Int. Cl.[7] ............................... G09G 5/08; G09G 5/02
(52) U.S. Cl. ......................... 345/157; 345/145; 345/150
(58) Field of Search ................................... 345/145, 339, 345/118, 131, 146, 157, 133, 134, 150, 440; 707/501; 348/445

(56) References Cited

U.S. PATENT DOCUMENTS

| | | | |
|---|---|---|---|
| 4,698,625 | 10/1987 | McCaskill et al. | 340/709 |
| 4,725,829 | 2/1988 | Murphy | 340/709 |
| 4,788,538 | 11/1988 | Klein et al. | 340/747 |
| 4,847,605 | * 7/1989 | Callahan et al. | 345/145 |
| 5,020,011 | 5/1991 | Stark et al. | 364/580 |
| 5,302,967 | 4/1994 | Yonezawa et al. | 345/131 |
| 5,315,313 | 5/1994 | Shinagawa | 345/145 |
| 5,483,258 | 1/1996 | Cornett et al. | 345/118 |
| 5,598,183 | * 1/1997 | Robertson et al. | 345/145 |
| 5,638,130 | 6/1997 | Linzer | 348/445 |
| 5,642,131 | * 6/1997 | Pekelney et al. | 345/145 |
| 5,655,093 | 8/1997 | Frid-Nielsen | 395/326 |
| 5,757,358 | 5/1998 | Osga | 345/146 |
| 5,764,215 | 6/1998 | Brown et al. | 345/118 |
| 5,808,601 | 9/1998 | Leah et al. | 345/145 |
| 5,815,150 | 9/1998 | Shimizu | 345/339 |
| 5,990,862 | * 11/1999 | Lewis | 345/145 |
| 6,040,824 | * 3/2000 | Kazuteru et al. | 345/173 |

* cited by examiner

Primary Examiner—Vijay Shankar
Assistant Examiner—Jeff Piziali (57) ABSTRACT

A hit-test system and methodology for use in a computer-based system having a display for searching a display pixel map in successively-increasing distances from a selected pixel location associated with a current cursor position in accordance with a predetermined search topology defined by pixel offset values. The pixel offset values may be determined a priori and stored in memory in, for example, a look-up table, may be determined algorithmically, or any combination thereof. The hit text system determines whether each queried pixel location in the display pixel map contains a color or other attribute indicative of a display element. Preferably, a maximum search distance which defines a range of pixel locations likely to include a display element of interest to the user while avoiding causing the user to select an undesired display element. The selected pixel location may be represented by a cursor positioned with a pointing device such as a mouse, light pen, keyboard controls, touch pad, etc. Preferably, a pixel location is also determined to be selected when the cursor dwells, or remains stationary, at a pixel location for a predetermined period of time.

39 Claims, 5 Drawing Sheets

SYSTEM AND METHOD FOR EFFICIENT HIT-TESTING IN A COMPUTER-BASED SYSTEM

RELATED APPLICATIONS

This application is a continuation application of U.S. patent application Ser. No. 08/863,461, entitled SYSTEM AND METHOD FOR EFFICIENT HIT-TESTING IN A COMPUTER-BASED SYSTEM, filed May 27, 1997 and now pending, the specification of which is hereby incorporated by reference in its entirety below.

BACKGROUND OF THE INVENTION

1. Field of the Invention

The present invention relates generally to computer-based systems and, more particularly, to hit-testing in a computer-based system.

2. Related Art

A common technique for presenting information to users of computer-based systems is through use of a graphical user interface (GUI). A graphical user interface is typically part of an environment provided by an operating system executed by a processor in the computer system. Generally, the GUI is controlled by the operating system in response to commands provided by a user and application programs or other processes executing on or accessible to the computer-based system.

Common to virtually all conventional GUIs is the use of a mouse or other pointing device in a display environment. A common problem in conventional display environments is that it at times difficult to graphically select a display element due to the relative size of the cursor and the display element, the number of display elements displayed simultaneously, etc. This inability to quickly and accurately graphically select a display element rendered on the display device, particularly when such a display element is one of many currently-rendered display elements, results in a system that is difficult and frustrating to use. What is needed, therefore, is a technique for selecting quickly and easily desired display elements.

SUMMARY OF THE INVENTION

The present invention is a hit-test system and methodology for use in a computer-based system having a display device. The invention searches a display pixel map in successively-increasing distances from a selected pixel location associated with a current cursor position in accordance with a predetermined search topology. The search topology may be defined by pixel offset values that are calculated, coded or stored in memory, such as in a look-up table.

A number of aspects of the invention are summarized below, along with different embodiments that may be implemented for each of the summarized aspects. It should be understood that the summarized embodiments are not necessarily inclusive or exclusive of each other and may be combined in any manner in connection with the same or different aspects that is non-conflicting and otherwise possible. These disclosed aspects of the invention, which are directed primarily to high performance capacitor charging systems and methodologies, are exemplary aspects only and are also to be considered non-limiting.

In one aspect of the invention, a hit-test system for use in a computer-based system having a display and a memory is disclosed. The hit-test system is configured to search a display pixel map of pixel data in successively-increasing distances from a selected pixel location for a pixel location having stored therein a portion of a display element. The search is performed in accordance with a search topology. The search topology may be defined by pixel offset values stored in the memory, wherein the pixel locations at each of the distances from the selected pixel location is determined by adding the pixel offset values to said selected pixel location. Alternatively, the search topology is defined algorithmically or through some combination of stored values and algorithms.

Preferably, the successively-increasing distances from the selected pixel location includes a maximum distance from said selected pixel location that is to be searched. The maximum distance defines a range of pixel locations likely to include a display element of interest to the user while preventing the selection of an undesired display element, wherein when no display element is rendered at a pixel located within said maximum distance, said hit-test system identifies a background region of the display as being selected by the user.

More than one display element may be located at a pixel location. The hit test system arbitrates between more than one display element rendered at a pixel location closest to said selected pixel location, thereby identifying a display element that is more likely to be a display element desired by the user.

The search topology may be any configuration, such as circular, elliptical, rectangular or the like. In one embodiment, the search topology is biased by an inverse of a linear aspect ratio of the display pixel map to provide a more intuitive search region.

In another aspect of the invention, a method for determining a graphical selection is disclosed. The method includes (a) identifying a user-selected pixel location; (b) querying a plurality of pixel locations at a distance from said selected pixel location; (c) determining which of said plurality of pixel locations contains a display element; and (d) repeating (b) and (c) for successively-increasing distances from said selected pixel location, wherein said plurality of pixel locations at each of said successively-increasing distances conforms to a search topology. The search topology may be determined algorithmically, by accessing predefined pixel offset values stored in memory, or any combination thereof.

In a further aspect of the invention, a hit-test system for use in a computer-based system having a display is disclosed. The hit-test system is configured to search a display pixel map having stored therein pixel data. The search is performed in successively-increasing distances from a selected pixel location associated with a cursor position in accordance with a first search topology. In one embodiment, the search topology is one of a plurality of search topologies, and wherein each of said plurality of search topologies is defined by pixel offset values stored in memory. In one particular implementation, the pixel offset values for each of said plurality of search topologies are stored in a look-up table for said search topology.

In a still further aspect of the invention, a memory for storing data for access by a program being executed on a computer-based system having a display is disclosed. The memory includes a data structure stored in said memory. The data structure includes information used by said program to identify, in response to a user selection, a display element displayed on the display that is closest to a current cursor position. The information in said data structure comprises pixel offset values for successively-increasing distances from the current cursor position, said successively-increasing distances defined by a search topology. The program accesses said data structure to retrieve successive portions of said pixel offset values, each portion associated with one of said successively-increasing distances, to determine which pixel locations to query whether a display element is rendered at that pixel location.

In a still further aspect of the invention, in a computer-based system including a display, a computer readable medium encoded with a program for execution by a processor is disclosed. The program, when executed, performs a search of a display pixel map of pixel data in successively-increasing distances from a selected pixel location for a pixel location at which a portion of a display element is rendered, wherein said search is performed in accordance with a search topology.

Further features and advantages of the present invention as well as the structure and operation of various embodiments of the present invention are described in detail below with reference to the accompanying drawings. In the drawings, like reference numbers indicate identical or functionally similar elements. Additionally, the left-most one or two digits of a reference number identifies the drawing in which the reference number first appears.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION

The present invention is a hit-test system and methodology for use in a computer-based system having a display device. The invention searches a display pixel map in successively-increasing distances from a selected pixel location associated with a current cursor position in accordance with a predetermined search topology. The search topology may be defined by pixel offset values that are calculated, coded or stored in memory, such as in a look-up table.

The present invention may be implemented in any computer-based system having a display wherein the user has the capability of selecting graphically, points on the display to identify a particular feature of interest. Typically, the user makes such a selection to perform operations or invoke functions on a selected display element or within the background region. The present invention provides significant advantages for systems having small display devices. For example, in one embodiment of the present invention described herein, the hit-test system is implemented in a computer-based signal measurement system. In particular, the disclosed implementation of the invention is in a digital oscilloscope. However, it should be understood that the present invention may be implemented in other test and measurement instruments such as an analog oscilloscope, logic analyzer, network analyzer, spectrum analyzer or waveform generator.

Figure 1:
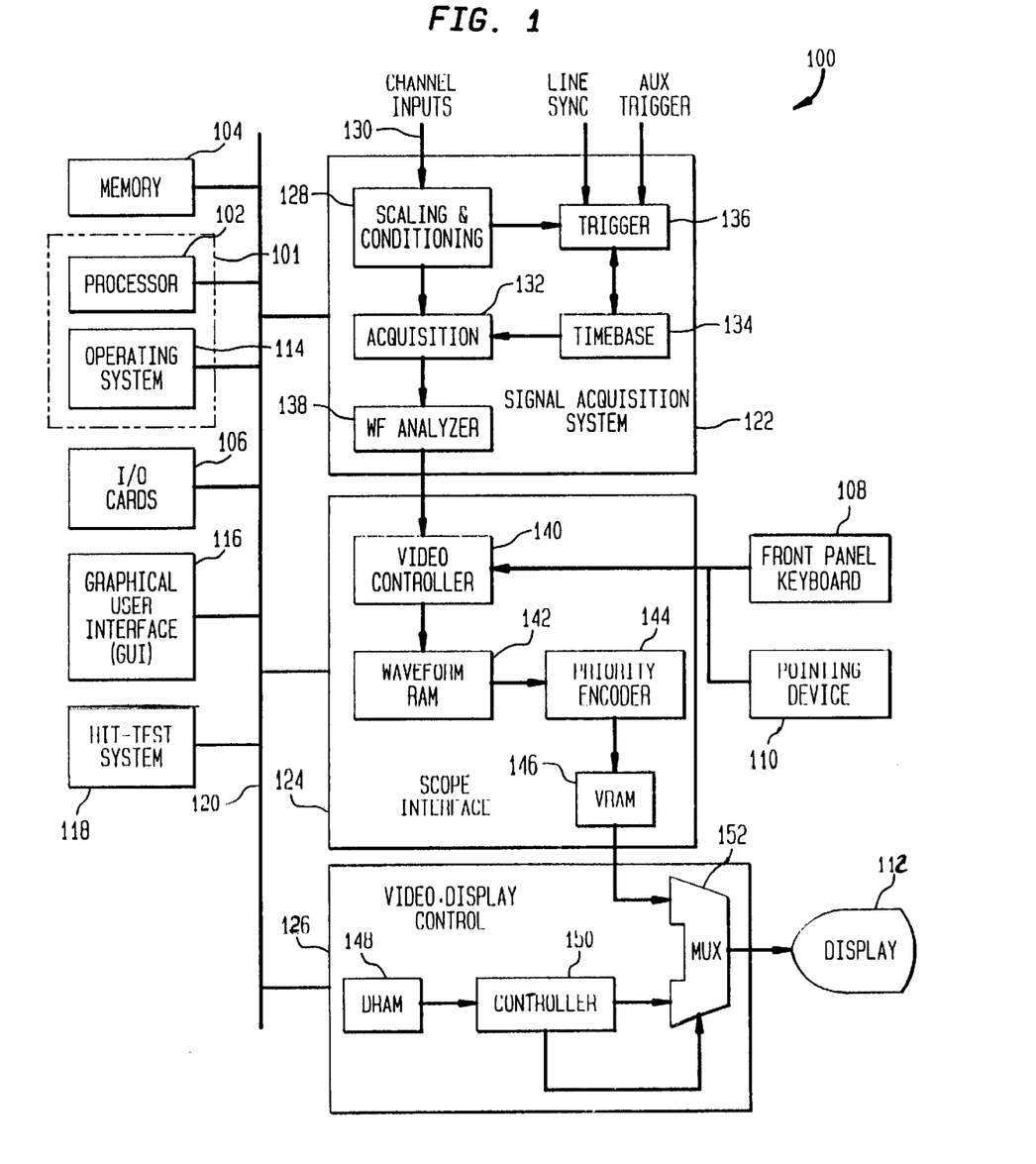
FIG. 1 is a functional block diagram of a digital oscilloscope suitable for implementing the hit-test system and method of the present invention.

FIG. 1 is a functional block diagram of an exemplary digital oscilloscope suitable for implementing the hit-test system and method of the present invention. Conventional signal measurement systems such as digital oscilloscopes sample, record and display time varying analog signals. Samples of an input signal are taken and quantized, and the resultant digital representations are stored in a waveform memory under the control of a sampling clock. The acquired data may subsequently be read out as locations in memory are sequentially addressed by a clock signal to provide digital data which can be converted to a time-varying output signal for a waveform display. The sampling clock may be operated at one of several selectable rates depending upon the frequency content of the input signal. The selection of the portion of the analog input signal which is sampled and stored is determined by appropriate triggering circuitry to enable the operator to display the desired portion of the waveform.

There are many types of display elements which can be presented in signal measurement systems in general and test and measurement instruments in particular. For example, in addition to the waveforms representing the signals currently received at the channel inputs, waveforms referred to as function waveforms may also be displayed. Function waveforms are waveforms created by processing the signal waveforms. Such processing may include, for example, performing arithmetic manipulations or combining multiple input signal waveforms in some predetermined manner. The resulting waveforms are placed in a display memory for subsequent retrieval and display. In addition, memory waveforms may also be displayed. Memory waveforms are waveforms which have been stored in memory for some predetermined time for later display. In addition to the above waveforms, other display elements such as marker indicators, trigger indicators, etc. are typically displayed.

Conventional test and measurement systems typically have numerous dials and knobs to control the many display elements which may be simultaneously visible on the display. However there is a limited amount of space to provide the large number of hardware controls. Accordingly, conventional test and measurement systems typically assign multiple functions to each control knob. This results in a complicated display panel which is often difficult to learn and use efficiently. To overcome this problem, some instruments have implemented what is commonly referred to as soft keys. Systems implementing soft keys provide a series of software-controlled function keys associated with physical buttons on the control panel. However, there are drawbacks to this approach as well. As the number of functions increases so too does the number of soft keys. Since the number of associated physical function keys adjacent to the soft keys is constant, as these additional functions are added to the system, a complicated multi-layered scheme of software-controlled functions is created. This hierarchy of soft keys is accessed through the limited number of physical keys on the instrument. A significant amount of time is required to navigate through the multiple layers to activate the desired function. In addition, the location of a desired function is not always intuitively associated with a higher level soft key and is therefore often difficult to locate.

Referring now to FIG. 1, the digital oscilloscope 100 includes commonly-available digital oscilloscope functionality designed to acquire, analyze and display a wide variety of signals generally in terms of the voltage of the signals versus time. The digital oscilloscope 100 preferably includes a general purpose computer system, which is programmable using a high level computer programming language, and specially programmed, special purpose hardware for performing signal acquisition, analysis and display functions.

The digital oscilloscope 100 includes a processor 102, a memory unit 104, input/output (I/O) interface cards 106, storage units (not shown) such as a hard disk drive and a floppy disk drive, one or more input devices such as front keyboard panel 108 and pointing devices 110 and display 112. The memory 104 is used for storage of program instructions and for storage of results of calculations performed by the processor 102. In a preferred embodiment, the memory 104 includes random access memory (RAM). The display is preferably a liquid crystal display and is logically or physically divided into an array of picture elements (pixels). The input/output (I/O) interface cards 106 may be modem cards, network interface cards, sound cards, etc.

The processor 102 is typically a commercially available processor, such as the Pentium microprocessor from Intel Corporation, PowerPC microprocessor, SPARC processor, PARISC processor or 68000 series microprocessor. Many other processors are also available. Such a processor usually executes a program referred to as an operating system 114, such as the various versions of the Windows operating systems from Microsoft Corporation, the NetWare operating system available from Novell, Inc., or the Unix operating system available from many vendors such as Sun Microsystems, Inc., Hewlett-Packard Company and AT&T. The operating system 114 controls the execution of other computer programs such as a graphical user interface (GUI) 116 and the hit-test system 118, and provides scheduling, input-output control, file and data management, memory management, and communication control and related services. The processor 102 and operating system 114 define a computer platform shown by dashes block 101, for which application programs in high level programming languages are written. The functional elements of the digital oscilloscope 100 communicate with each other via bus 120.

The digital oscilloscope 100 includes a signal acquisition system 122, a scope interface 124 and video control 126. The signal acquisition system 122 includes scaling and conditioning 128 that receives input signals through channel inputs 130. The scaling and conditioning unit 128 and acquisition unit 132 include well-known high frequency electronics for signal acquisition, signal conditioning, and analog-to-digital conversion, all of which are controlled by the computer system 101 and are considered to be well-known in the art. The timebase 134 drives the analog-to-digital conversion process performed in acquisition 132, specifying when to sample the input signals and how many samples are to be taken. The trigger 136 synchronizes the acquisition process through the timebase 134, enabling the user to arrange a trigger event to obtain a stable waveform display of the desired features of one or more of the input signals. Trigger 136 may be based upon a line sync or auxiliary trigger input, as is well known in the art.

The waveform analyzer 138 performs measurement processes for developing the waveform for display. It contains hardware and software to perform well-known operations such as setting the analog-to-digital codes for the acquisition unit 132 and mapping the resulting digital information to the physical pixel locations which are ultimately presented on display 112 under the control of GUI 116. The pointing device 110 and/or the keyboard 108 are used to move a cursor on the GUI-controlled display 112 to select display elements under the cursor. The pointing devices 110 may include any number of pointing devices such as a mouse, trackball or joy stick. Of course, the cursor may be controlled with one or more keyboards 108 located externally or integrated into a front panel of the digital oscilloscope 100.

The scope interface card 124 includes a video controller 140 that controls the rendering of pixels into the waveform random access memory (RAM) 142. It also receives display element control commands and cursor input information from the front panel keyboard 108 and the pointing device(s) 110. The waveform RAM 142 includes a data structure for each pixel location on the display 112. The data structures contain information regarding every display element that is to be drawn at each pixel location. Although there may be multiple display elements which are to be drawn at a given pixel location, only one color may be rendered at that location. The waveform RAM 142 supplies the priority encoder 144 with this information. The priority encoder 144 prioritizes the competing display elements. For example, if the user arranged a marker and a waveform such that they are located in the same pixel location, then the priority encoder 144 selects that display element with a highest predetermined priority. In such an example, the color of the marker is rendered at the pixel location providing a display that appears to show the marker over the waveform. The priority encoder then sends the selected color to the VRAM 146 which then causes the pixel to be rendered in the indicated color.

The video display controller 126 includes a dynamic random access memory (DRAM) 148 which contains data specifying a color for each pixel in the display 112. Likewise, the video random access memory (VRAM) 146 also contains data specifying a color for each pixel in the display 112. The computer system 101 controls the information in DRAM 148 while the signal acquisition system 122 controls information in the VRAM 146. For each pixel in the display 112, the video controller 126 selects whether the pixel in the display 112 is specified from VRAM 146 or DRAM 148. In general, information in VRAM 146 includes digitized waveforms being generated by the system 122 with high rates of change that are much too fast for software processing by the computer system 101 for real-time display of the waveforms on display 112.

Video controller 126 includes a controller 150 and a multiplexer 152. Controller 150 controls which of the two inputs to the multiplexer 152 are processed into display signals for transmission to the display 112 under the control of the graphical user interface 116. The controller 150 typically monitors color data sent from the DRAM 148 and may be programmed to switch the multiplexer 152 to a different input when a particular programmed color is received from the DRAM 148. A rectangular pixel area is typically defined within DRAM 148 with the programmed color, typically dark gray. The programmed color is not displayed, but instead serves as a data path switch control for the multiplexer 152. Therefore, within the programmed color rectangle, display data comes from VRAM 146. When various control functions are needed, an interactive dialog box is drawn within the programmed color rectangle by the.

The hit-test system 118 implements a fast and efficient method for selecting a display element which is presented on the display 112 under the control of the GUI 116. The hit-test system 118 searches in successively-increasing distances from a current cursor position in a GUI-controlled display in accordance with a predetermined search topology. The search topology is preferably defined by pixel offset values stored in a look-up table which is preferably stored in local memory.

The software routines for performing the hit-test methodology in accordance with the invention typically reside in memory 104 and/or disk storage devices, and may be stored on a computer-readable medium such as, for example, magnetic disk, compact disc or magnetic tape and may be loaded into the digital oscilloscope 100 using an appropriate peripheral device as known in the art.

Preferably, the hit-test system 118 is implemented in any well-known programming language such as C or C++. Those skilled in the art will appreciate that different implementations, including different function names, programming languages, data structures, and/or algorithms may also be used in embodiments of the present invention other than those described below. It should be further understood that the invention is not limited to a particular computer platform, particular operating system, particular processor, or particular high level programming language, and that the hardware components identified above are given by way of example only. The hit-test system may be implemented, for example, in dedicated hardware, firmware, or any combination thereof.

Figure 2:
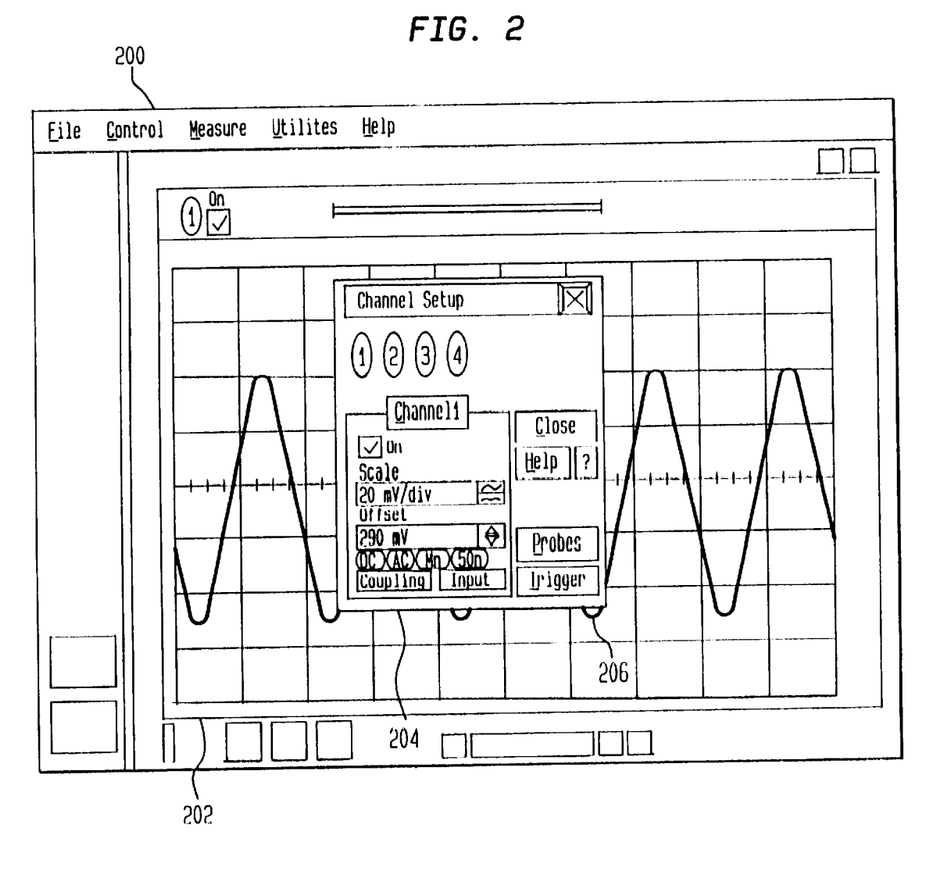
FIG. 2 is a perspective view of a graphical user interface on the digital oscilloscope illustrated in FIG. 1.

FIG. 2 is an illustration of a window rendered in the graphical user interface 120. In the illustrated display, a dialog box 204 and a waveform 206 are displayed within a window 202. A perimeter area 200 is defined within the DRAM 148 by a Windows operating system running on computer system 101. The rectangular area 202 is drawn in DRAM 148 in the programmed color. The interactive dialog 204 is drawn by the Windows operating system in DRAM 148 within rectangle 202. The VRAM 146 contains digitized waveform images from the signal acquisition system 122. Within the rectangle 202, where pixel data with DRAM 148 is the programmed color, a digitized waveform 206 from VRAM 146 is displayed. The illustrated dialog box 204 obscures all of the waveform 206 behind the dialog box. In general, waveform 206 may have a feature of interest that is obscured by the dialog box 204. Accordingly, in a preferred embodiment the dialog box is translucent.

Figure 3:
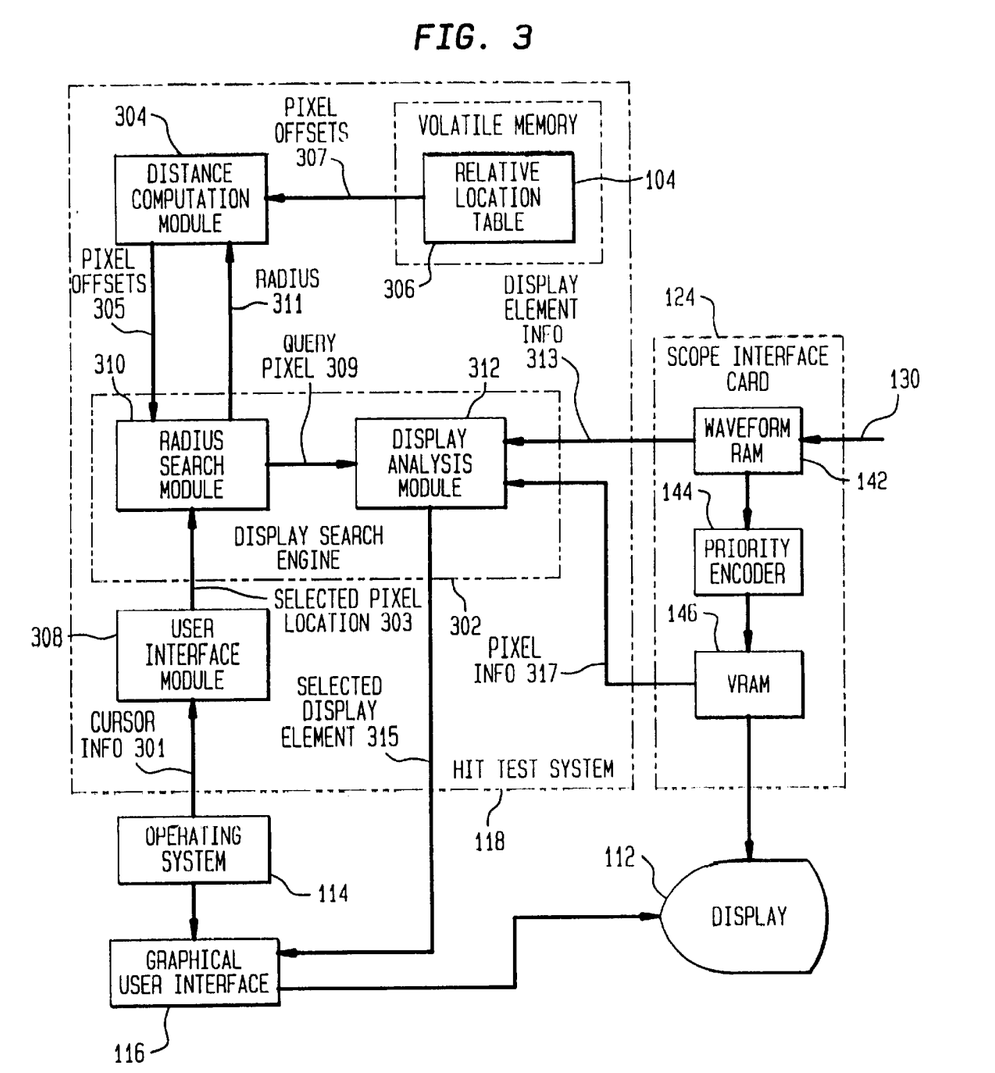
FIG. 3 is a functional block diagram of one embodiment of the hit-test system implemented in the digital oscilloscope illustrated in FIG. 1.

As noted, the exemplary implementation of the present invention is in a test and measurement device, such as the digital oscilloscope 100, having a display 112 and, in this implementation, graphical user interface 120. A functional block diagram of one embodiment of the hit-test system 118 of the present invention implemented in digital oscilloscope 100 is shown in FIG. 3. The hit-test system 118 includes a display search engine 302 that, in response to a user's selected pixel location, searches a display pixel map located in the VRAM 146. The search is performed at successively-increasing distances or radii from the selected cursor location in accordance with a predetermined search topology. A distance computation module 304 provides the display search engine 302 with absolute pixel offset values corresponding to a given search radius. The display search engine 302 adds the pixel offset values to the selected pixel location to arrive at pixel locations in the pixel map that are to be queried. The pixel locations are queried to determine whether the pixels are currently rendering a portion of a display element. The pixel offset values are preferably stored in random access memory (RAM) accessible by the distance computation module 304.

The hit-test system 118 also includes a user interface module 308 for interfacing with the digital oscilloscope 100 to obtain cursor information 301. As shown, the digital oscilloscope 100 is a computer-based system containing computer system 101. In such embodiments, the above information is typically obtained from the operating system 114 running on the processor 102. As will be explained in detail below, in a preferred embodiment, the user interface module 308 also receives timing information 305 from the operating system 102.

The cursor information includes a current position of the cursor, a user selection indication, and cursor timing information. The user interface module 308 determines whether a pixel location has been selected by the user based upon these inputs. The user may select a pixel location through well-known pointing devices introduced above, such as a mouse, trackball, joy stick, keyboard, etc. In a preferred embodiment of the present invention, the user may also select a desired pixel location simply by allowing the cursor to remain stationary, or dwell, at or near the desired pixel location. In this embodiment, the user interface module 308 monitors the time the cursor dwells at a single pixel location. If this time duration, referred to as dwell time, is greater than a predetermined threshold duration, then the user is taken to have made a selection at that cursor location. In a preferred embodiment, the dwell time is approximately 750 milliseconds, although other dwell times which are indicative of a user's desire to select a display element or background region may be used.

Since the hit-test search process of the present invention is performed when a user makes a selection, incorporation of a dwell time prevents the present invention from being invoked continuously or unnecessarily as the cursor is moved across the display 112. Thus, the present invention interprets a dwell of a short period of time as a user's likely intent to make a selection. Preferably, the dwell time is adjustable, such as through a display control panel or at initialization. Once the user interface module 308 has determined that the user has selected a particular pixel location, the user interface module 308 generated the selected pixel location for use by the display search engine 302.

As noted, the display search engine 302 searches in successively-increasing distances from the selected cursor location in a pixel map display in accordance with a predetermined search topology. The display search engine 302 primarily includes a radius search module 310 and a display analysis module 312. The radius search module 310 operates with the distance computation module 304 to determine the pixels 309 to be queried for a given search topology. The radius search module 310 adds the absolute pixel offset values 305 provided by the distance computation module 304 for a given radius 311 to the selected pixel location 303 to arrive at the query pixels 309 for the given radius 311. The display analysis module 312 receives the query pixel locations 309 which are to be queried from the radius search module 310 and accesses the display pixel map in the VRAM 146 to determine if there is a display element rendered at each of the query pixel locations. If there is more than one display element which is to be rendered at that location, then the display analysis module 312 arbitrates amongst the display elements to select that display element that is most likely to be the display element desired by the user. The radius search module 310 and display analysis module 312 are discussed in detail below.

The radius search module 310 preferably sends the distance computation module 304 successively-increasing radii starting from a radius of zero through some maximum radius described below. The radius 311 may be an integer number representing a distance in number of pixels which is to be used by the distance computation module 304 to determine the associated absolute pixel offset values for a given search topology. The radius search module 310 adds the returned pixel offset values 311 to the selected pixel location 303 to generate a series of query pixel locations 309. As noted, the radius search module 310 begins at a distance of zero pixels and increases the radii in successively-increasing integer values until the display analysis module 312 locates one or more display elements in one of the query pixel locations 309 or until the maximum searched distance has been reached.

The radius search module 310 determines the maximum distance from the selected pixel location which is to be searched by the display analysis module 312. This maximum radius is the number of pixels likely to include a display element of interest to the user while avoiding the selection of a display element which is not desired by the user. For example, in a preferred embodiment, the graphical user interface 120 in the digital oscilloscope 100 offers graphics functions which are invoked by selecting a point in the background region of the display. If a user intends to select a point in the background region, the hit-test system 300 will locate the nearest display element, which may be a significant distance from the cursor location. This will occur regardless of whether it is the user's intent to select such a display element if no limits are placed on the maximum distance which is searched by the display search engine 302. Such a condition may cause the user to inadvertently "drag" the selected display element or perform some other undesired operation on the selected display element.

Thus, to provide areas which qualify as blank and to provide a response that is more likely to reflect the user's intent, the radius search module 310 limits the distance away from the selected pixel position which is searched for each search topology. The maximum distance of the search is preferably programmable or modifiable in real-time to accommodate dynamically-changing criteria. For example, in one embodiment, the maximum search distance is reduced when there is a large number of high priority display elements simultaneously displayed on the display 112. Alternatively, the maximum search distance may be determined in accordance with what a particular user may anticipate; that is, what a user would expect to achieve with a given cursor position. In an alternative embodiment, the maximum search limit may be programmable through a display control panel currently available in Windows applications or other well-known means.

As noted, the display analysis module 312 receives the query pixels 309 from the radius search module 310 and accesses the display pixel map display and other elements of the implementing system to determine if there is one or more display elements rendered at the query. If there is more than one display element, then the display analysis module 312 will arbitrate between the multiple display elements which are to utilize the pixel location to determine which of the display elements is more likely to be the display element desired by the user.

In the illustrative embodiment of the digital oscilloscope illustrated in FIG. 1, the display analysis module 312 accesses the VRAM 146 to determine the display element which is closest to the selected pixel location by determining whether there is a color associated with the pixel location. If the color uniquely corresponds to a display element that is currently displayed on the GUI 116, then the determination as to which display element is to be selected is completed. However, if the pixel information received from the VRAM 146 is ambiguous, then the display analysis module 312 must arbitrate to determine the selected display element.

In one embodiment, to determine whether the pixel information 317 returned from the VRAM 146 is ambiguous, the display analysis module 312 consults globally-available state information from the oscilloscope 100. This information indicates which channels are currently turned on in the oscilloscope 100, which markers are currently active, etc. If multiple display elements are activated that are the same color, then there is a potential ambiguity if a pixel location contains that same color. In other words, under such circumstances, the color of the pixel alone is insufficient to enable the display analysis 312 to determine which display element is rendered at that pixel.

This may occur under a number of different conditions. First, certain display elements may share the same color. For example, formula waveform 1 function is always rendered in a same color as a channel 1 waveform. Likewise, in one implementation of the digital oscilloscope 100, all of the marker indicators are in a common color. Under such circumstances, the display analysis module 312 obtains additional display element information 313 from the oscilloscope 100 to determine which display elements are rendered at the queried pixel location.

As noted, the signal acquisition system 122 provides the acquired signals to the waveform RAM 142. The waveform RAM 142 includes a data structure for each pixel location. These data structures are preferably 16 bits in length and contain information regarding every display element that is to be drawn at the associated pixel location. When the VRAM 146 yields pixel information 317 which is ambiguous, the display analysis module 312 queries the waveform RAM 142 to view the display element information 313 contained in the above-noted data structure associated with the queried pixel. The display element information 313 identifies which display elements are actually to be rendered at the pixel location.

The display analysis module 312 then retrieves the display element information 313 from the waveform RAM 142 identifying which of the display elements are intended to be rendered at that pixel. When the condition exists wherein two display elements having the same color are rendered at the same pixel location, the display analysis module 312 simply selects the display element which has a higher priority since it is most consistent with the user's intent. If the user is presented with a particular color at a certain pixel location, when the user selects that location it is assumed that the user prefers to select the display element which is rendered in that color.

When the condition arises where there are two or more display elements having the same priority which are rendered at the same queried pixel location, then the display analysis module 312 will apply its own prioritization scheme to identify a selected display element. Any such prioritization scheme may be used which is appropriate for the desired application and implementing system.

The relative location table 306 is described in detail below with reference to FIGS. 3 and 4A–4B. As noted, the relative location table 306 may be a static look-up table located in local memory such as volatile memory 104. The relative location table 306 is accessed by the distance computation module 304 to obtain absolute pixel offset values 307 for a series of successively-increasing radii 311 conforming to a predetermined search topology. In a preferred embodiment, the relative location table 306 is created prior to the real-time operations of the implementing digital oscilloscope 100, typically by some well-known utility application. The relative location table 306 is described below with reference to an exemplary search topology.

Figure 4A:
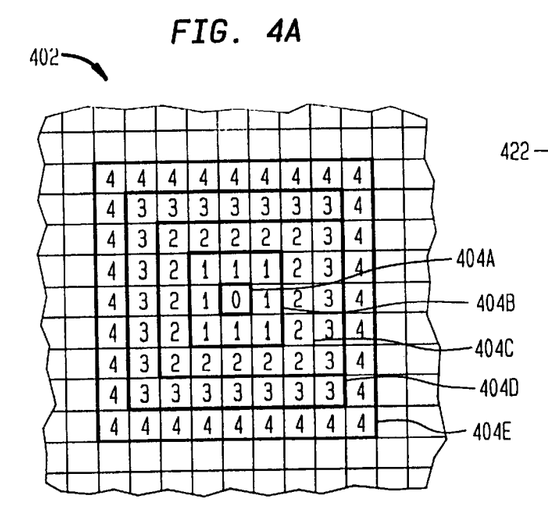
FIG. 4A is a diagram illustrating an exemplary pixel map showing the successively-increasing distances from a selected cursor position for a square search topology searched by the hit-test system of the present invention.

FIG. 4A illustrates a portion of a pixel map display contained in VRAM 146. The pixel map 402 shows five increasingly-successive radii for a square search topology. The radii 404A–404E (collectively and generally referred to as radius 404) each have a series of associated pixel locations. For example, there are eight pixel locations at a radius of 1 pixel, twelve pixel locations associated with a radius of 2 pixels, etc. As noted, each series of pixels follows the predetermined search topology represented by the relative location table 306.

Figure 4B:
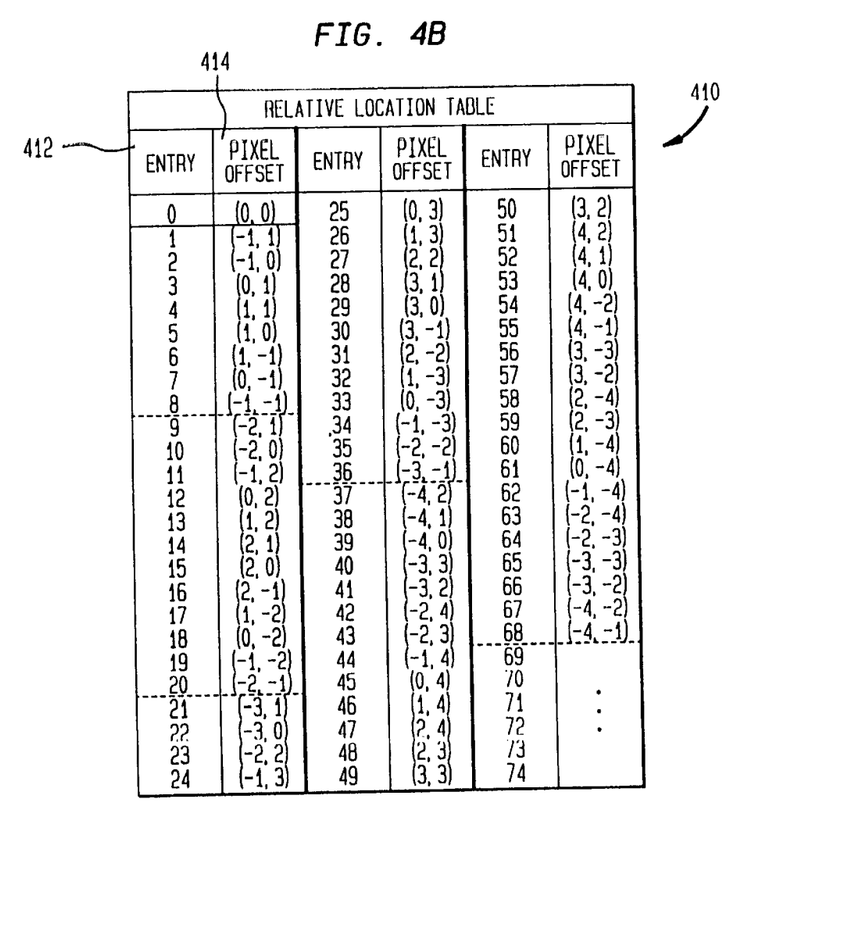
FIG. 4B is a diagram illustrating an exemplary relative location containing the pixel offset values for searching the pixel locations illustrated 4A.

The relative location table 306 which provides the pixel offset values for the square search topology with a maximum distance of 4 pixels from the selected cursor position is shown in FIG. 4B. The exemplary relative location table 410 has entries 412 each containing a single absolute pixel offset value 414. For example, for a radius of 2 pixels, the pixel offset values 414 are stored from entries 9–20. Likewise, for a radius of 4 pixels, the pixel offset values are stored in entries 37–68. Dashed horizontal lines are provided in the illustrated relative location table 410 to distinguish between the series of pixel offset values associated with each radius.

In one embodiment of the present invention, the relative relocation table 306 provides pixel offset values for a circular search topology. Alternative preferred embodiments include a square and elliptical search topologies. In still other alternative embodiments other search topologies such as FIG. 8's may also be implemented.

In one embodiment, the relative location table 306 is created to accommodate the different types of displays. If the display 112 has the same number of pixels-per-linear inch in the X dimension as in the Y dimension, then a circle is the preferred and likely optimal search topology. Oftentimes, however, displays do not have the same number of pixels per linear inch in the X and Y dimensions. In order to create a field of search which is equidistant about the cursor position and therefore intuitive to the user, the shape of the search topology dictated by the relative location table 306 is biased to offset the different pixels per linear dimension in such displays. Specifically, the values in the relative location table 306 are biased by the inverse of the linear aspect ratio of the pixels. As a result, to achieve, for example, a circular search topology, the pixel offset values in the relative location table 306 may reflect an ellipse rather than a circle.

As noted, the relative location table 306 is preferably retrieved during system initialization. In such an embodiment, the relative location table values would be modified prior to loading the table into the volatile memory 330 or additional tables 306 may be saved in non-volatile memory to accommodate the different display types. In the latter embodiment, the hit-test system 300 would initialize the relative location table 306 having the elliptical set of pixel offset values rather than the circular set of values if necessary. This determination may be made by obtaining configuration information from the implementing system 100.

Typically, a request to the operating system 320 would result in such information being provided to the hit-test system 118.

As noted above, in certain aspects of the invention, the distance computation module 304 obtains the pixel offset values 307 from the relative location table 306 and provides such values to the radius search module 310. The radius search module 310 then adds these pixel offset values to the selected pixel location to obtain query pixel locations 309. In an alternative embodiment, the queried pixel locations 309 are derived in a different manner to achieve different processing efficiency and memory size requirements. In such embodiments, a combination of the relative location table 306 described above in combination with some simple algorithmic processing performed by the radius search module 310 may be implemented. Such embodiments may take advantage of the symmetry of the typical search topology. For example, if the search topology is an ellipse, the most basic component or segment of the ellipse would be the pixel values located in a quarter or quadrant of the ellipse. The other three quadrants may be determined through the use of knowledge of the symmetry conditions by simply adding and subtracting the appropriate pixel offset values by −1. This computation may be quickly performed by the radius search module 310 prior to adding these offset values to the selected cursor location. Significantly, this eliminates 75% of the entries in the relative location table 306 for such a search topology. However, this approach also requires additional processing to be performed by the radius search module 310. Accordingly, this embodiment is advantageous in environments where memory space is expensive and the additional work performed by the radius search module 310 may be absorbed in the real-time computations without adversely affecting processing efficiency. It is noted, however, that the processing in such an embodiment is minimal due to the simple arithmetic functions which may need to be performed depending upon the configuration of the search topology.

Figure 4C:
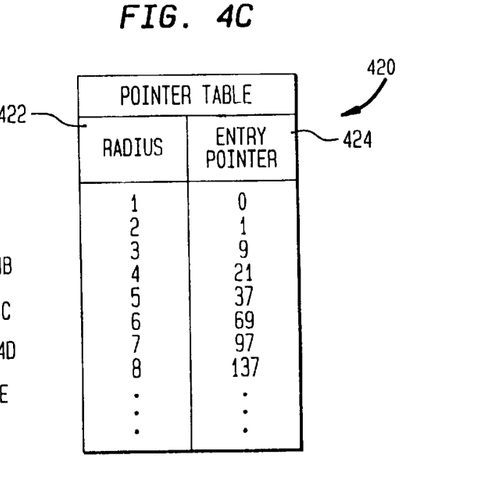
FIG. 4C is an illustration of a pointer table utilized in a preferred embodiment of the distance computation module illustrated in FIG. 3.

As noted, the distance computation module 304 receives a radius 309 from the radius search module 310 and queries the relative location table 306 for absolute pixel offset values associated with the particular radius 309 and a desired search topology. In a preferred embodiment of the present invention, the distance computation module 304 includes a starting pointer table to efficiently access the relative location table 306. The starting pointer table includes a series of pointers into the relative location table 306, one for each radius for a given search topology. For example, in the exemplary square search topology shown in FIG. 4A and the associated relative location table 410 shown in FIG. 4B, the distance computation module 304 includes a pointer table 420 as illustrated in FIG. 4C. The pointer table 420 includes a series of entries, one for each radius for the square topology illustrated in FIG. 4A. The associated entry pointer 424 is a pointer to the entry where the pixel offset values begin for the associated radius. For example, for a radius of 2, the first pixel offset value begins at entry 9 in the relative location table 410. Likewise, for a radius of 4, the pixel offset values in the relative location table begin at entry number 37. Also, the display computation module 304 may use the values in the pointer table to determine the number of pixels which must be retrieved from the relative location table 410. For example, for a radius of 2 the distance computation module retrieves 12 (21−9=12) pixel offset values starting at entry 9 and ending at entry 20. This enables the distance computation module 304 to take advantage of the predetermined number of absolute pixel offset values associated with each radius for a given search topology to increase speed.

There are many advantages to using the relative location table 306 utilized in certain aspects of the present invention.

It may be computationally expensive to compute the pixel offset values for each of the radii because of the functions that have to be performed to determine the search topology. Instead, in the illustrative embodiment of the present invention these values are stored a priori, in a fast look-up table, that is a simple static data structure stored in local memory. This enables the present invention to search any pattern without the computational burden that more complicated topologies impose when calculated in real time. Preferably, the pixel offset values are computed off-line in some type of utility program as noted above. At initialization, the static relative location table 306 is simply loaded into local memory and is thereafter accessible by the distance computation module 304.

In addition to the significant efficiency improvements achieved by using the relative location table 306 in accordance with the present invention, other benefits are also provided. Numerous relative location tables 306 may be installed in non-volatile memory and retrieved as desired to achieve a given search topology. This provides the hit-test system 118 with significant flexibility simply by swapping the appropriate tables in local memory.

The process for performing the hit-test methodology of the present invention is now described. The hit-test method of the present invention locates the display element that is nearest to a selected cursor location. First, the appropriate user inputs are continually monitored to determine when the user desires to select a display element or background region. Once a user action to select a display element or background region has been detected, a series of pixel offset values are obtained, preferably through the use of a fast look-up table, which are added to the selected cursor position to identify pixel locations which are to be queried at a given radius. The pixel locations are then tested and this process is repeated for successively-increasing radii conforming to a predetermined search topology. The details of the hit-test methodology of the present invention is described below with reference to FIG. 5.

Figure 5:
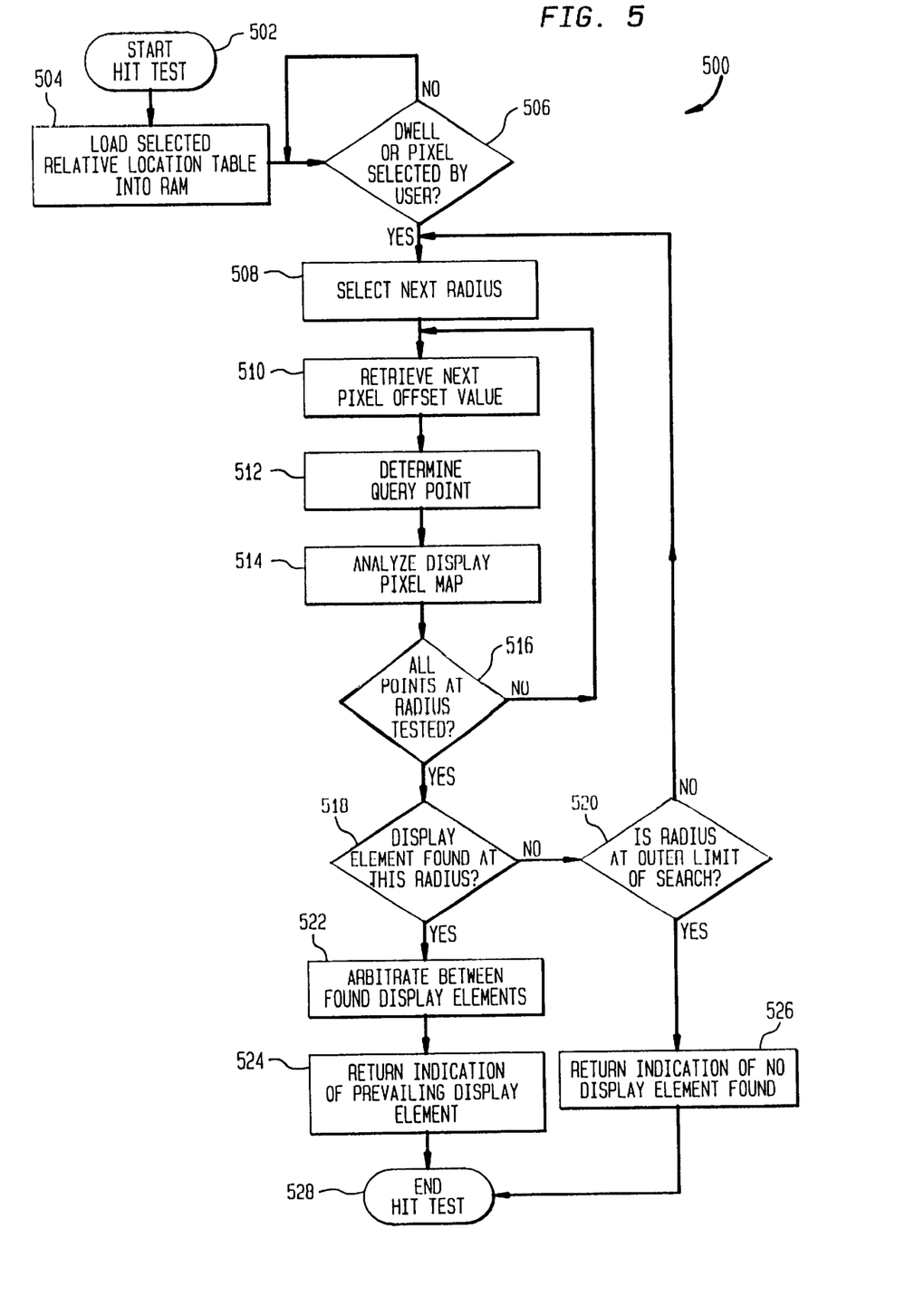
FIG. 5 is a flowchart of one embodiment of the hit-test method of the present invention performed by the hit-test system when implemented in the digital oscilloscope illustrated in FIG. 1.

At start block 502 the hit-test method 500 of the present invention is invoked. Typically, this occurs upon system power-up and the hit-test process is performed continuously as a background process in the implementing system 100. At block 504 the relative location table 306 associated with the selected search topology is loaded into volatile memory 104.

At block 506 the hit-test system continually monitors the appropriate parameters of the oscilloscope 100 to determine when a pixel has been selected by the user. As noted, this may be performed in any number of ways appropriate for the implementing system and available hardware interface. Preferably, the appropriate information is obtained through calls to the operating system. In addition, at step 506 the time that the user allows the cursor to dwell at a particular pixel location is monitored and, if above a predetermined threshold, is considered to be a user selection of the underlying pixel location.

Once it is determined that the user has selected a pixel location processing enters an outer loop within which a series of processes are repeatedly performed for each of any number of successively-increasing radii in the predetermined topology. First, at block 508, a single radius is selected. Then, processing enters an inner loop wherein a series of processes are repeatedly performed for all of the pixel locations associated with the selected radius. The steps performed in the inner loop cause all of the pixel locations at the selected radius to be searched regardless of whether a display element is found in any one or more of them.

First, at block 510 a pixel offset value is retrieved from the relative location table 306. Then, at block 512 the retrieved pixel offset values are used to determine a series of queried points. This is typically achieved by adding the retrieved pixel offset values to the selected pixel location. At block 514, the queried pixel locations in the display pixel map are analyzed to determine if they contain colors indicating a display element at those locations. This process is performed for all points at the selected radius by block 516 and the associated loop.

At block 518 it is determined whether a display element has been found at the selected radius. If not, processing then continues at block 520 wherein it is determined whether the selected radius is the maximum radius which is to be searched. If no display elements have been located at this radius and this radius is not the maximum radius to be searched, then processing continues at block 508 wherein the above process is repeated for another radius in the given search topology.

If, at block 518, it is determined that one or more display elements have been found at the selected radius, then processing continues at block 522 whereat arbitration is performed between multiple found display elements. Here, the hit-test system accesses the appropriate parameters in the implementing system 100 to determine which display elements are rendered at each pixel location. The highest priority display element is then determined to be the selected display element based on a prioritization scheme implemented by the system 100 and/or the hit-test system 118.

Thus, at block 518 it is determined whether searching at a greater radius is necessary. If one or more display elements were found at one of these searched pixel locations for the current radius, then processing does not have to progress to greater radii since it is assumed that the user preferred to select the closest display element. It is noted that all of the pixel locations associated with a given radius are searched or queried even though a display element may be found at one of the pixels. In addition, even though the pixel elements in the relative location table 306 are presented in a specific order, that order is arbitrarily chosen and each of the pixel locations at a given radius are equal candidates. Therefore, the search is completed for each radius and does not cease upon locating a first display element since there may be other display elements at that same radius which include the display element desired by the user.

If one or more display elements were found at the queried pixel locations for a given radius, then processing continues at block 524 wherein an indication of the prevailing display element is returned to the implementing system 100. Alternatively, if no display elements were found at any of the radii for a given search topology and selected pixel location, then processing continues at block 526 wherein an indication that no display element was located is returned to the implementing system 100. After either blocks 524 or 526, the hit-test method of the present invention ceases at block 528.

Other features of the present invention are disclosed in U.S. patent application Ser. No. 08/863,461, entitled SYSTEM AND METHOD FOR EFFICIENT HIT-TESTING IN A COMPUTER-BASED SYSTEM, filed May 27, 1997 and naming as inventor Jay A. Alexander, the specification by which is hereby incorporated by reference in its entirety.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A hit-test system for use in a computer-based system having a display and a memory, said hit-test system configured to search a display pixel map of pixel data in successively-increasing distances from a selected pixel location for a pixel location having stored therein a portion of a display element, wherein said search is performed in accordance with a search topology.

2. The hit-test system of claim 1, wherein said search topology is defined by pixel offset values stored in the memory, wherein said pixel locations at each of said distances from said selected pixel location is determined by adding said pixel offset values to said selected pixel location.

3. The hit-test system of claim 1, wherein said search topology is defined algorithmically.

4. The hit-test system of claim 1, wherein stored in each of said plurality of pixel locations is an attribute indicative of whether a portion of a display element is rendered at said pixel location.

5. The hit-test system of claim 4, wherein said attribute is a value representing a color of a display element rendered at said pixel location.

6. The hit-test system of claim 1, wherein said search topology has a predetermined symmetry.

7. The hit-test system of claim 3, wherein said successively-increasing distances from said selected pixel location comprises a maximum distance from said selected pixel location that is to be searched.

8. The hit-test system of claim 7, wherein said maximum distance defines a range of pixel locations likely to include a display element of interest to the user while preventing the selection of an undesired display element, wherein when no display element is rendered at a pixel located within said maximum distance, said hit-test system identifies a background region of the display as being selected by the user.

9. The hit-test system of claim 8, wherein said selected pixel location is identified by a cursor controlled by a pointing device.

10. The hit-test system of claim 8, wherein said selected pixel location is a pixel location at which said cursor dwells for a predetermined period of time.

11. The hit-test system of claim 8, wherein more than one display element may be located at a pixel location, and further wherein said hit test system arbitrates between said more than one display element rendered at a pixel location closest to said selected pixel location, thereby identifying a display element that is more likely to be a display element desired by the user.

12. The hit-test system of claim 1, wherein said search topology is a circular search topology.

13. The hit-test system of claim 1, wherein said search topology is an elliptical search topology.

14. The hit-test system of claim 6, wherein said search topology is biased by an inverse of a linear aspect ratio of the display pixel map.

15. The hit-test system of claim 1, wherein said hit test system is incorporated in a graphical user interface.

16. A method for determining a graphical selection comprising:
    (a) identifying a user-selected pixel location;
    (b) querying a plurality of pixel locations at a distance from said selected pixel location;
    (c) determining which of said plurality of pixel locations contains a display element; and
    (d) repeating (b) and (c) for successively-increasing distances from said selected pixel location, wherein said plurality of pixel locations at each of said successively-increasing distances conforms to a search topology.

17. The method of claim 16, wherein (a) comprises:
    (1) monitoring one or more system inputs to determine when the user has performed a display element select operation.

18. The method of claim 17, wherein (a) further comprises:
    (2) monitoring an amount of time a cursor dwells at a particular pixel location; and
    (3) identifying said particular pixel location as said selected pixel location when a duration of said dwell is greater than a predetermined time.

19. The method of claim 16, wherein said search topology is determined algorithmically.

20. The method of claim 16, wherein said search topology is determined by accessing predefined pixel offset values stored in memory.

21. The method of claim 16, wherein (b) comprises:
    (1) obtaining a plurality of pixel offset values from a memory device corresponding to said distance from said selected pixel location; and
    (2) adding said plurality of pixel offset values to said selected pixel location to arrive at said plurality of pixel location to be queried.

22. The method of claim 21, further comprising:
    (e) before (a), computing said pixel offset values conforming to said search topology; and
    (f) after (e), storing said pixel offset values in the memory device.

23. The method of claim 21, wherein (c) comprising:
    (1) determining which of said plurality of queried pixel location contains a color corresponding to a display element;
    (2) arbitrating between multiple display elements which are located at one of said plurality of pixel locations; and
    (3) selecting said display element of interest from all found display elements.

24. The method of claim 23, wherein (c)(1) comprises:
    (1) analyzing a display pixel map at each of said pixel locations to determine whether said queried pixel location contains a color corresponding to a display element.

25. The method of claim 22, wherein (d) comprises:
    (1) repeating (b) and (c) for successively-increasing distances from said selected pixel location up to a maximum distance from said selected pixel location.

26. A hit-test system for use in a computer-based system having a display, said hit-test system configured to search a display pixel map having stored therein pixel data, said search performed in successively-increasing distances from a selected pixel location associated with a cursor position in accordance with a first search topology.

27. The hit-test system of claim 26, wherein said first search topology is one of a plurality of search topologies, and wherein each of said plurality of search topologies is defined by pixel offset values stored in memory.

28. The hit-test system of claim 27, wherein said pixel offset values for each of said plurality of search topologies are stored in a look-up table for said search topology.

29. The hit-test system of claim 27, wherein said hit-test system searches said pixel display map until either a pixel in which a display element is rendered is identified or when said successively-increasing distance search is a maximum distance from said cursor position.

30. A memory for storing data for access by a program being executed on a computer-based system having a display, the memory comprising:

a data structure stored in said memory, said data structure including information used by said program to identify, in response to a user selection, a display element displayed on the display that is closest to a current cursor position, wherein the information in said data structure comprises pixel offset values for successively-increasing distances from the current cursor position, said successively-increasing distances defined by a search topology, whereby the program accesses said data structure to retrieve successive portions of said pixel offset values, each portion associated with one of said successively-increasing distances, to determine which pixel locations to query whether a display element is rendered at that pixel location.

31. In a computer-based system including a display, a computer readable medium encoded with a program for execution by a processor, the program, when executed, performing a search of a display pixel map of pixel data in successively-increasing distances from a selected pixel location for a pixel location at which a portion of a display element is rendered, wherein said search is performed in accordance with a search topology.

32. The computer readable medium of claim 31, wherein said search topology is defined by pixel offset values stored in the memory, wherein said pixel locations at each of said distances from said selected pixel location is determined by adding said pixel offset values to said selected pixel location.

33. The computer readable medium of claim 31, wherein said search topology is defined algorithmically.

34. The computer readable medium of claim 33, wherein said successively-increasing distances from said selected pixel location comprises a maximum distance from said selected pixel location that is to be searched.

35. The computer readable medium of claim 34, wherein said maximum distance defines a range of pixel locations likely to include a display element of interest to the user while preventing the selection of an undesired display element, wherein when no display element is rendered at a pixel located within said maximum distance, said hit-test system identifies a background region of the display as being selected by the user.

36. The computer readable medium of claim 35, wherein said selected pixel location is identified by a cursor controlled by a pointing device.

37. The computer readable medium of claim 31, wherein said search topology is an elliptical search topology.

38. The computer readable medium of claim 31, wherein said search topology is a rectangular search topology.

39. The computer readable medium of claim 36, wherein said search topology is biased by an inverse of a linear aspect ratio of the display pixel map.

* * * * *